(12) United States Patent
Morton

(10) Patent No.: US 6,584,132 B2
(45) Date of Patent: Jun. 24, 2003

(54) SPINODAL COPPER ALLOY ELECTRODES

(75) Inventor: Richard G. Morton, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/776,044

(22) Filed: Feb. 1, 2001

(65) Prior Publication Data

US 2002/0080840 A1 Jun. 27, 2002

Related U.S. Application Data

(63) Continuation-in-part of application No. 09/703,697, filed on Nov. 1, 2000.

(51) Int. Cl.$^7$ ............................................. H01S 3/097
(52) U.S. Cl. .......................................... 372/57; 372/87
(58) Field of Search ................................ 372/57–59, 87

(56) References Cited

U.S. PATENT DOCUMENTS

| | | | | |
|---|---|---|---|---|
| 4,373,970 A | * | 2/1983 | Scorey et al. | 148/11.5 C |
| 4,388,270 A | * | 6/1983 | Stavish et al. | 420/473 |
| 4,742,527 A | * | 5/1988 | Wiedemann et al. | 372/87 |
| 4,860,300 A | * | 8/1989 | Baumler et al. | 372/57 |
| 5,220,575 A | * | 6/1993 | Bosch et al. | 372/87 |
| 5,993,574 A | * | 11/1999 | Harkness et al. | 148/554 |

FOREIGN PATENT DOCUMENTS

| JP | 56020133 A | * | 2/1981 |
|---|---|---|---|

\* cited by examiner

*Primary Examiner*—Paul Ip
*Assistant Examiner*—Davienne Monbleau
(74) *Attorney, Agent, or Firm*—John R. Ross

(57) ABSTRACT

Electrodes comprised of spinodal copper alloys. Applicant's tests have shown erosion rates of these alloys under certain environmental conditions are a factor of 5 or more lower than erosion rates of similar prior art copper alloys. In one application, the erosion of spinodal electrodes was at least an order of magnitude lower than the prior art material. A preferred application of these electrodes are as electrodes in excimer lasers which utilize a circulating laser gas containing fluorine. A preferred spinodal copper alloy is a copper-tin-nickel alloy known as spinodal bronze. These alloys are prepared using spinodal decomposition. This material forms atomic layers several atoms thick. The spinodal decomposition process permits atoms of one kind to concentrate to an extent while maintaining a relatively uniform crystal structure. A specific alloy of spinodal bronze commercially available which has been tested by Applicant with amazing results is comprised primarily of about 80 percent copper, about 7 percent tin and about 12.5 percent nickel.

7 Claims, 8 Drawing Sheets

SPINODAL COPPER ALLOY ELECTRODES

This application is a continuation-in-part of Ser. No. 09/703,697, filed Nov. 1, 2000. This invention relates to electrodes and in particular to electrodes operating in corrosive atmospheres such as excimer lasers.

BACKGROUND OF THE INVENTION

The principal components of a prior art KrF excimer laser chambers are shown in FIG. 1. This chamber is a part of a laser system used as a light source for integrated circuit lithography. These components include a chamber housing 2. The housing contains two electrodes cathode 84 and anode 83 each about 55 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz or greater. (Gas velocities of about 10 m/s for each 1000 Hz pulse rate is typical.) The chamber includes a water cooled finned heat exchanger 6 for removing heat added to the laser gas by the fan and by electric discharges between the electrodes. Blower 4 is typically a squirrel cage type tangential fan providing high gas flow but at relatively low differential pressure. The chamber may also include baffles 60 and 64 and vanes 66 and 68 for improving reducing discharge caused acoustic effects and the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power supply which causes a discharge between the electrodes lasting about 30 nanoseconds to produce a gain region about 20 mm high, 3 mm wide and 525 mm long. (Two capacitors of a peaking capacitor bank are shown at 62.) The discharge deposits about 2.5 J of energy into the gain region. As shown in FIG. 2, lasing is produced in a resonant cavity, defined by an output coupler 20 and a grating based line narrowing unit (called a line narrowing package or LNP, shown disproportionately large) 22 comprising a three prism beam expander, a tuning mirror and a grating disposed in a Littrow configuration. The energy of the output pulse 3 in this prior art KrF lithography laser is typically about 10 mJ.

FIG. 3 shows an enlarged view of cathode 84 and anode 83. Each is about 3 cm wide but the discharge region 85 is only about 3 to 4 mm wide. The direction of gas flow is shown at 86 and a gas flow of 20 m/s is indicated. The cathode and anode are typically brass. The cathode is typically slidingly mounted on an insulator 84a and the anode is typically mounted on a metal support 83A.

These KrF lithography lasers typically operate in bursts of pulses at pulse rates of about 1000 to 2000 Hz. Each burst consists of a number of pulses, for example, about 80 pulses, one burst illuminating a single die section on a wafer with the bursts separated by down times of a fraction of a second while the lithography machine shifts the illumination between die sections. There is another down time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular so that maintenance down time is minimized.

Maintaining high quality of the laser beam produced by these lasers is very important because the lithography systems in which these laser light sources are used are currently required to produce integrated circuits with features smaller than 0.25 microns and feature sizes get smaller each year. Laser beam specifications limit the variation in individual pulse energy, the variation of the integrated energy of series of pulses, the variation of the laser wavelength and the magnitude of the bandwidth of the laser beam.

Typical operation of electric discharge laser chambers such as that depicted in FIG. 1 causes electrode erosion. Erosion of these electrodes affects the shape of the discharge which in turn affects the quality of the output beam as well as the laser efficiency. Typically, anode erosion in these excimer lasers is two to three times as severe as cathode erosion. Electrode erosion is the result of a complex combination of physical phenomena including fluorine chemical attack and ion induced sputter. Use of alloys of copper for electrodes for gas discharge lasers is well known. For example, a common electrode material is a brass known as C36000 which is comprised of 61.5% copper, 35.5% zinc and 3% lead. It is known to anneal brass parts before they have been machined to make the parts less brittle.

ArF excimer lasers are very similar to KrF excimer lasers except that the laser gas comprises argon, neon and fluorine. The effects of electrode erosion are known to be more severe in ArF lasers than in KrF lasers, primarily because ArF lasers are more sensitive to loss mechanisms.

Spinodal copper alloys are well-known copper alloys, first studied in the early 1930's. The process of spinodal decomposition hardens the copper alloys by creating regions of periodically varying concentrations of the alloy components without creating precipitates. Spinodal decomposition is reported to increase both hardness and ductility of copper alloys. A spinodal copper alloy (designated as C72900 ASTM B740-84) which has a composition of 77% copper, 15% nickel and 8% tin is commercially available and is widely used for bushings, bearings, springs and electronic connectors. It combines high yield strength and formability with good stress relaxation, electrical conductivity and corrosion resistance. The spinodal properties are produced by annealing the alloy at temperatures between about 200° C. and about 520° C. FIG. 5 is a TTT diagram extracted from a paper by Zhao and Notis, Acta metall., Vol. 46, No. 12, pp. 4203–4218, 1998. These materials are known to be good choices for sleeve bearings. Spinodal copper alloys are available from suppliers such as Anchor Bronze & Metal with offices in Bay Village, Ohio.

What is needed is a gas discharge laser having electrodes with reduced erosion rates.

SUMMARY OF THE INVENTION

The present invention provides electrodes comprised of spinodal copper alloys. Applicant's tests have shown erosion rates of these alloys under certain environmental conditions are a factor of 5 or more lower than erosion rates of similar prior art copper alloys. In one application, the erosion of spinodal electrodes was at least an order of magnitude lower than the prior art material. A preferred application of these electrodes are as electrodes in excimer lasers which utilize a circulating laser gas containing fluorine. A preferred spinodal copper alloy is a copper-tin-nickel alloy known as spinodal bronze. These alloys are prepared using spinodal decomposition. This material forms atomic layers several atoms thick. The spinodal decomposition process permits atoms of one kind to concentrate to an extent while maintaining a relatively uniform crystal structure. A specific alloy of spinodal bronze commercially available which has been tested by Applicant with amazing results is comprised primarily of about 80 percent copper, about 7 percent tin and about 12.5 percent nickel. It is commercially available and sold under the tradename, Nicomet®3 Spinodal Bronze.

DETAILED DESCRIPTION OF PREFERRED EMBODIMENTS

Pulse Power Supply System

Figure 3:
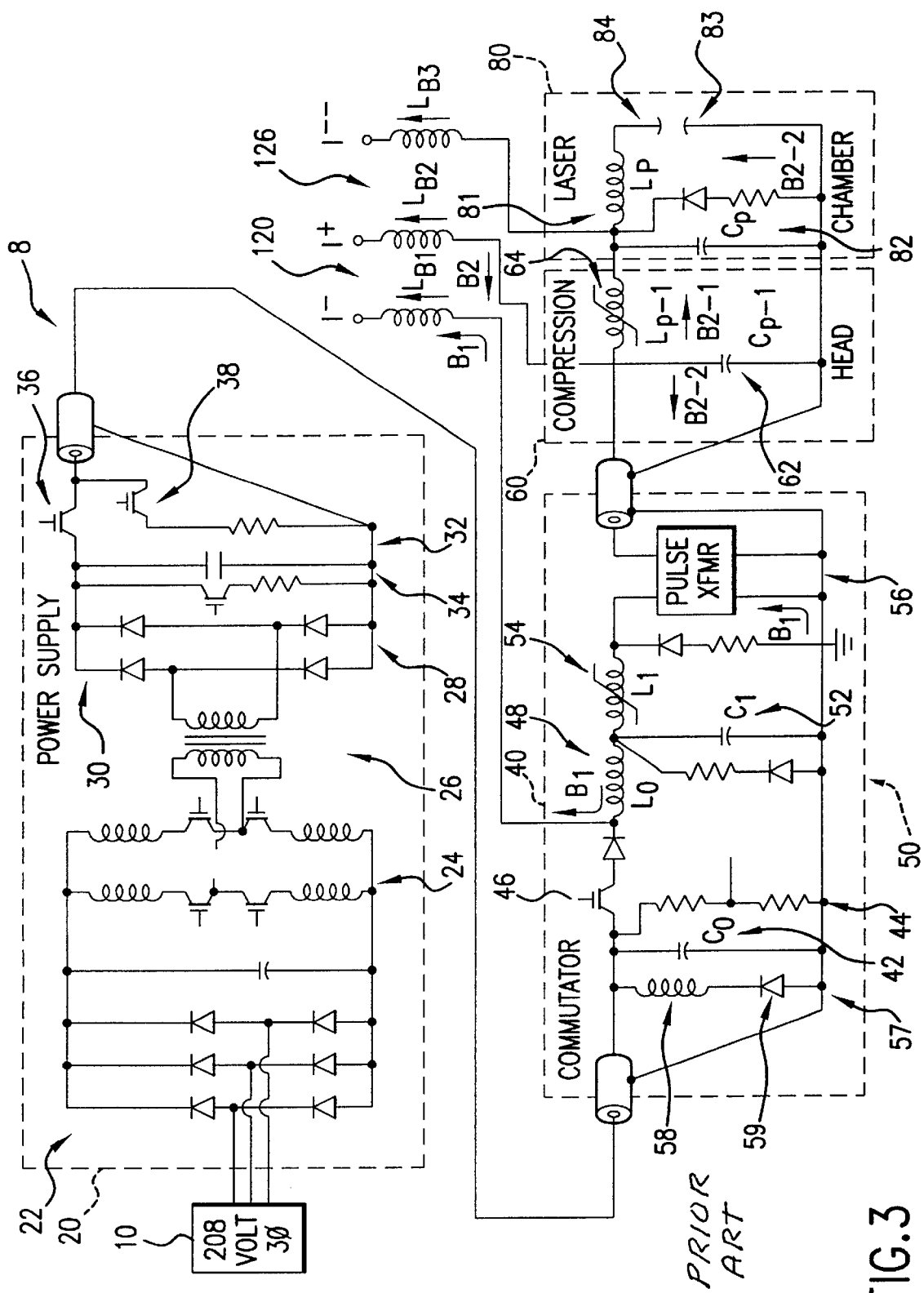
FIG. 3 shows an electrical drawing of a prior art pulse power system.

The principal components of an electrical circuit 8 for providing pulse power to produce electrical discharges in a gas discharge laser are shown in FIG. 3. The pulse power system operates from a standard 208-volt, 3 phase electrical source. A power supply using rectifier 22, inverter 24, transformer 26 and rectifier 30 charges 8.1 micro-Farad charging capacitor $C_0$ 42 to a voltage level between about 500 to 1200 volts as directed by a laser control processor (not shown). The laser control processor directs the closing of an IGBT switch 46 when a pulse is desired which causes the energy on $C_0$ to be discharged into the follow-on portions of the pulse power system. The charge on $C_0$ is transferred successively to capacitor bank $C_1$ 52 through inductor 48 then through saturable inductor 54 and through voltage transformer 56 to capacitor bank $C_{p-1}$ 62 and then through saturable inductor 64 to peaking capacitor bank $C_p$ 82. As shown in FIG. 3, peaking capacitor bank $C_p$ is connected electrically in parallel with electrodes 84 and 83.

Figure 4A:
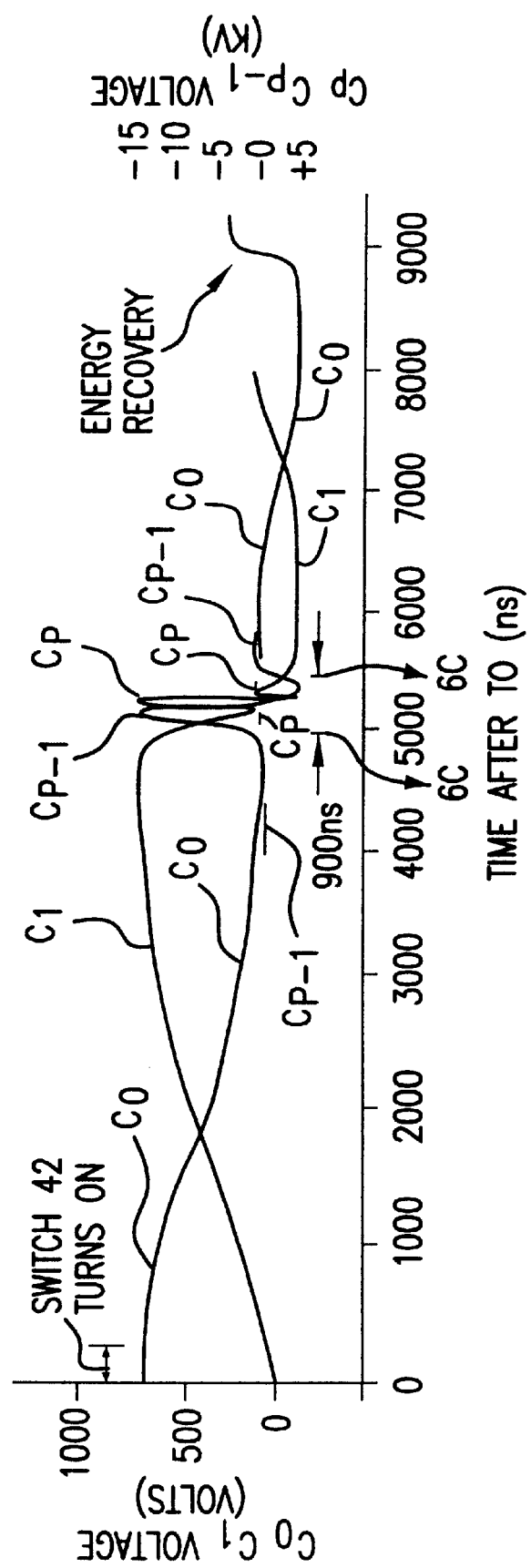
FIGS. 4A, B and C show pulse shapes.
Figure 4B:
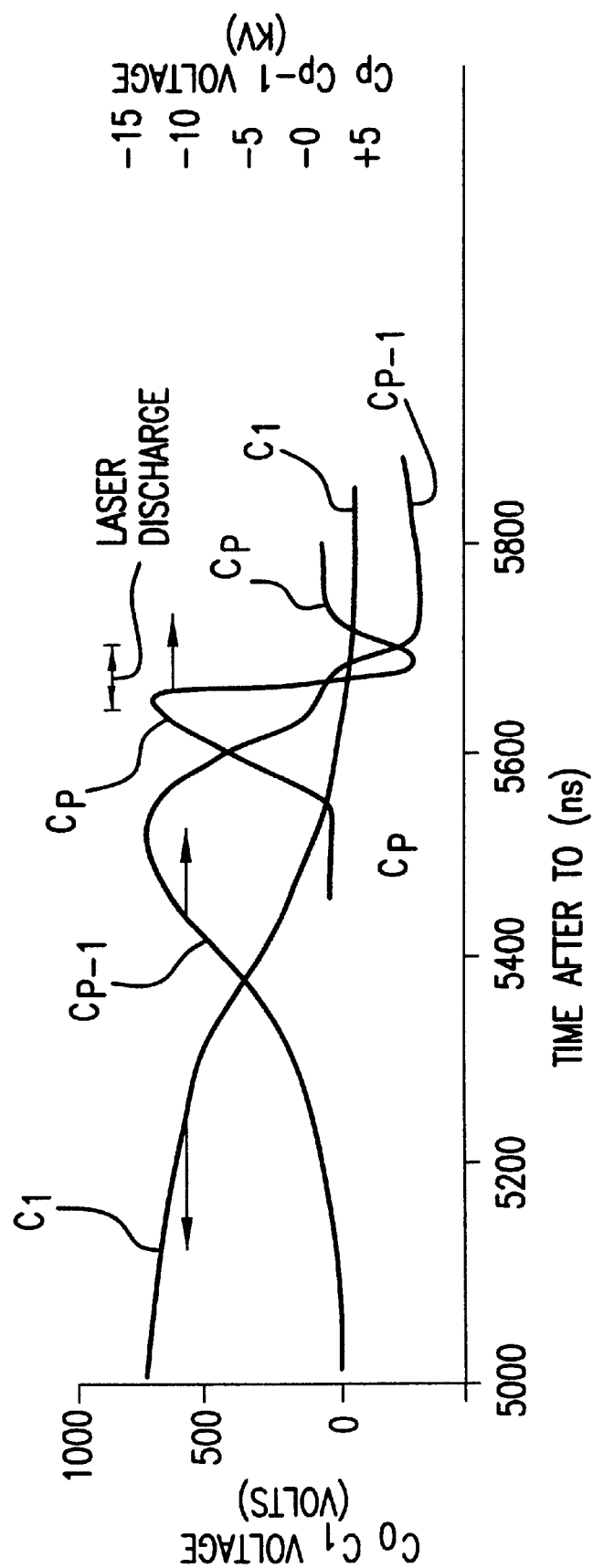

FIG. 4A shows the potential on capacitor banks $C_0$, $C_1$, $C_{p-1}$ and $C_p$ as a function of time beginning with the closing of switch 42 and for the following 9 microseconds. FIG. 4B shows an 800 ns time slice just before and after the discharge. The reader should note that the peaking capacitor bank $C_p$ is charged to approximately −15,000 V just prior to the discharge. The discharge lasts about 30 ns. During the discharge, the electron flow is first from the upper electrode, cathode 84 to the lower grounded electrode, anode 83. A current "overshoot" charges $C_p$ to a positive value of about +6,000 V at which time the downward flow of electrons is reversed after which the electron flow is from the lower grounded electrode to the upper electrode during the last approximately 15 ns of the discharge, all as shown in FIG. 4B.

Erosion

Applicants have discovered that electrode erosion occurs on both electrodes but that the erosion rate of the grounded electrode (anode 83) for both KrF lasers and ArF lasers is about four times that of the high voltage electrode (cathode 84). Also, operation normally results in an insulating layer of metal fluorides being built up very gradually on portions of the anode. In some cases near the end of life of the electrodes, the portion of the discharge surface covered by the layer can be between 50% to 80% or more. In the regions covered by the fluoride layer discharge current flows through tiny holes which typically tend to have approximately circular cross sections with diameters of about 50 to 100 microns. The surfaces covered by the fluoride layer do not suffer substantial further erosion but the erosion rate is increased on the non-covered discharge surfaces as the non-covered surface area decreases. (Also, there appears to be some severe localized erosion on the covered surfaces at the locations of the tiny holes.) Electrode erosion and fluoride build up in prior art lasers typically becomes so severe that at about 5 to 10 billion pulses on KrF lasers, the laser beam no longer meets quality specifications. At this time typically the laser chamber is replaced with a chamber with new electrodes. A replacement chamber costs several thousand dollars and replacement requires a temporary shutdown of integrated circuit production. As indicated in the background section, electrode erosion is more consequential in ArF lasers than KrF lasers such that the erosion typically necessitates chamber replacement after only about 1 billion pulses.

Most electric discharge lasers used for integrated circuit lithography utilize brass as the electrode material. Many other materials have been tested in efforts to discover better electrode material, but to the best of Applicant's knowledge none have been proven to be significantly better than brass taking into consideration all costs including cost of laser manufacture and cost of operation. Many otherwise excellent electrode materials are not compatible with the extremely reactive fluorine gas in these chambers.

Sputtered Metal Ions—Important Part of Discharge

Figure 1:
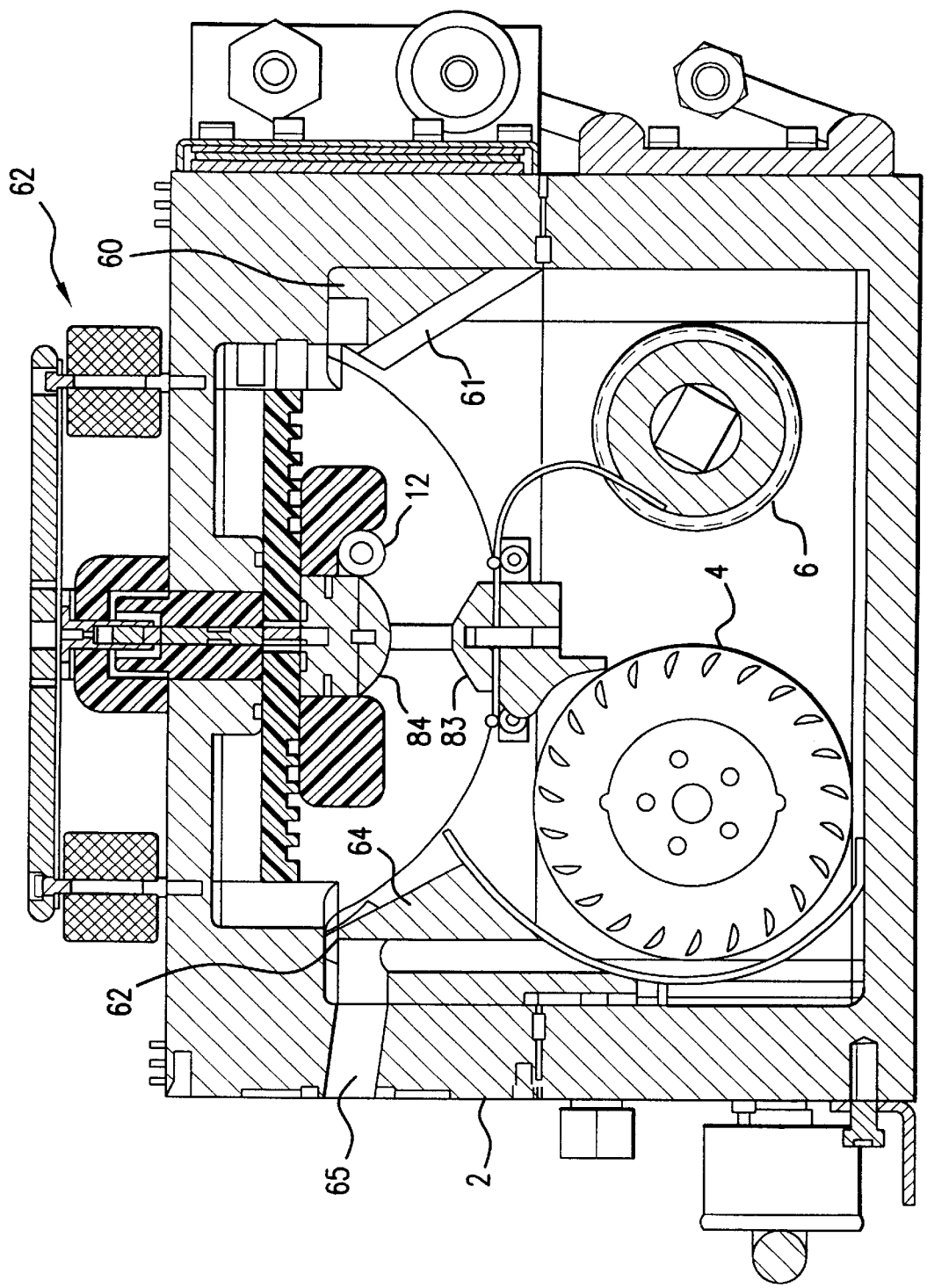
FIG. 1 shows a cross section of a prior art excimer laser chamber.
Figure 1A:
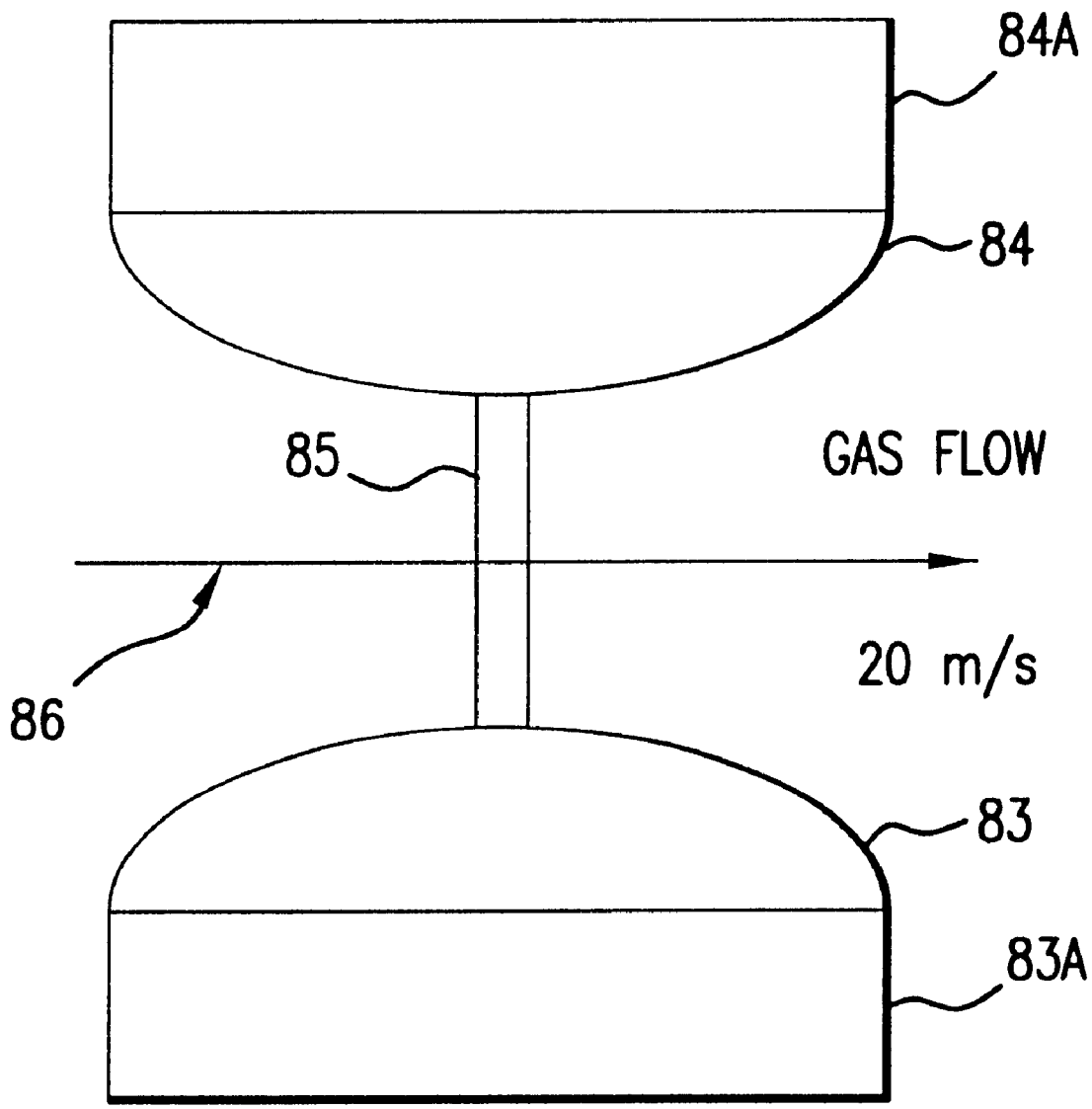
FIG. 1A is an enlarged view of the electrodes.
Figure 2:
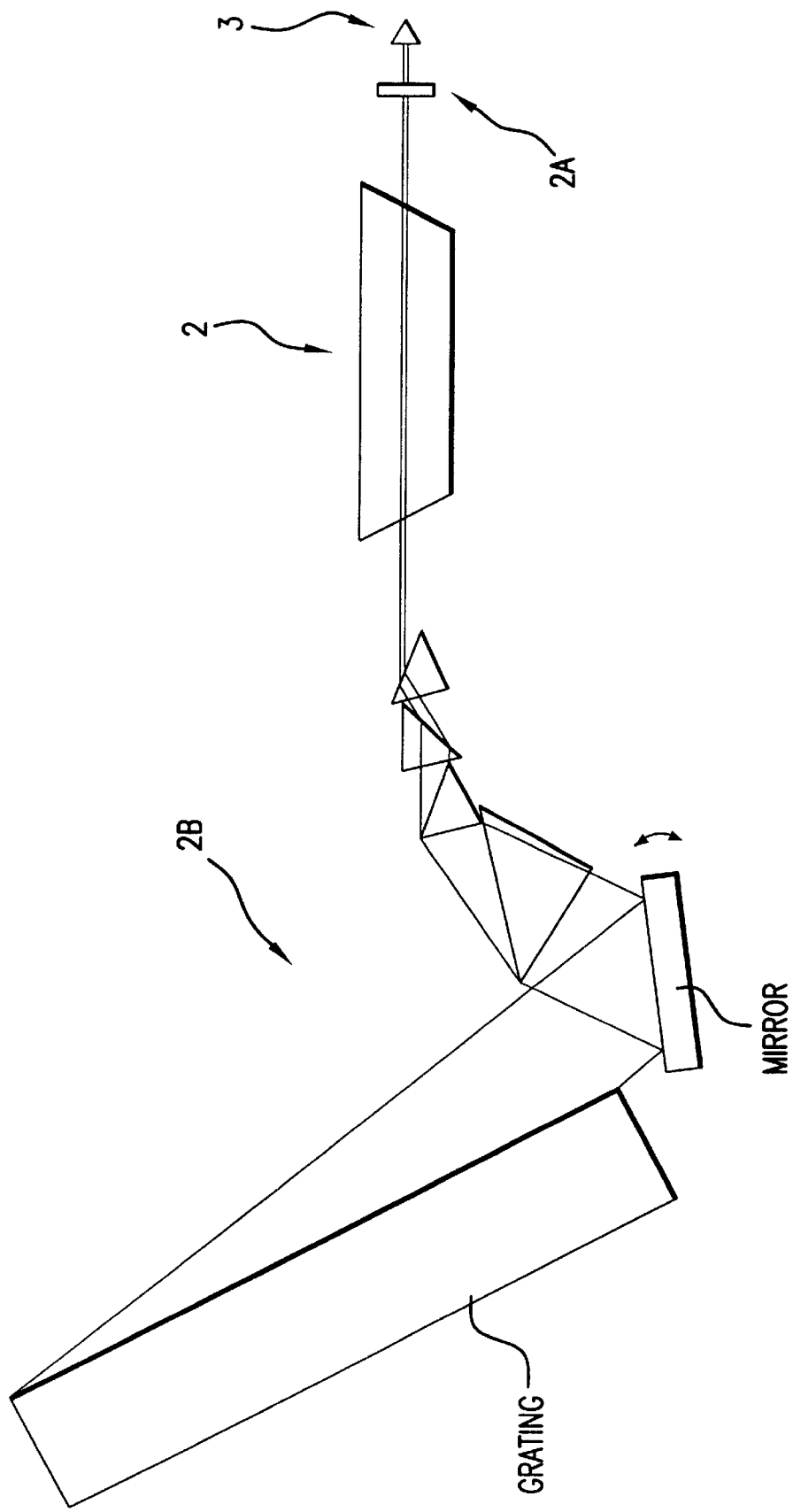
FIG. 2 is a block diagram of a narrow band laser system.

In order to create a good laser active media, a uniform discharge plasma must be created between the electrodes. Initially the gas in the gap between the electrodes is preionized with preionizer 12 shown in FIG. 1. As the voltage builds up on the electrodes a substantial portion of the plasma, in the regions close to the cathode is produced by ion sputtering of the electrode material. Metal atoms sputtered from the electrodes are mostly in vapor form and a substantial portion of the metal atoms are ionized and help form a positive ion cathode "fall" region immediately adjacent to the surface of the cathode creating an extremely large electric field which may contribute to the flow of electrons from the cathode and also accelerates electrons leaving the cathode. This process applies first to cathode 84 during the first portion of each pulse. However, because the polarity of the electrodes switch about half-way though the pulse, as shown in FIG. 4B, this effect also occurs to a much less extent at anode 83 which at that time functions as a cathode (i.e., the negative electrode). Both during and after the pulse the metal ions may be attracted back to the electrodes depending on the rapidly changing electric field conditions, but many combine with fluorine and/or are blown away by the circulating laser gas. Thus, some electrode erosion is probably essential to the proper functioning of the gas discharge laser. The problem is to pick an electrode material that erodes enough to cause the laser to function properly and not so much as to limit the life of the laser chamber.

Issues

There are five important issues to deal with in developing a better electrode for electric discharge lithography lasers using fluorine containing laser gas:

1) electrode erosion seriously affects beam quality,
2) electrode erosion currently limits laser chamber life,
3) anode erosion is about three to four times cathode erosion,
4) fluoride layer buildup on the anode is a problem, and
5) maintaining good gas flow conditions in the discharge gap is very important.

The various embodiments of the present invention described herein deal with these issues. The electrodes satisfy the following criteria:

1) the electrodes comprise an erosion surface which erodes slowly over several billion laser pulses with the erosion not substantially affecting beam quality,
2) the erosion surfaces resists fluoride insulation buildup on discharge regions, and
3) the electrodes are designed to provide improved gas flow to permit repetition rates of 1,000 Hz to 6,000 Hz or greater without substantial turbulence in the discharge region.

Annealed Copper Alloys

Figure 5A:
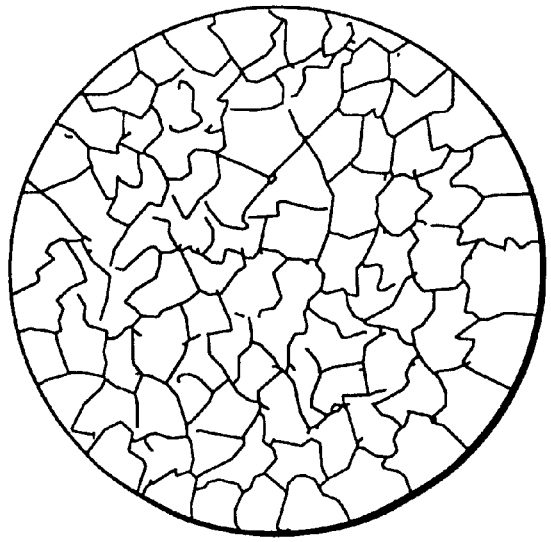
FIGS. 5A and 5B are microscopic sketches before and after annealing.
Figure 5B:
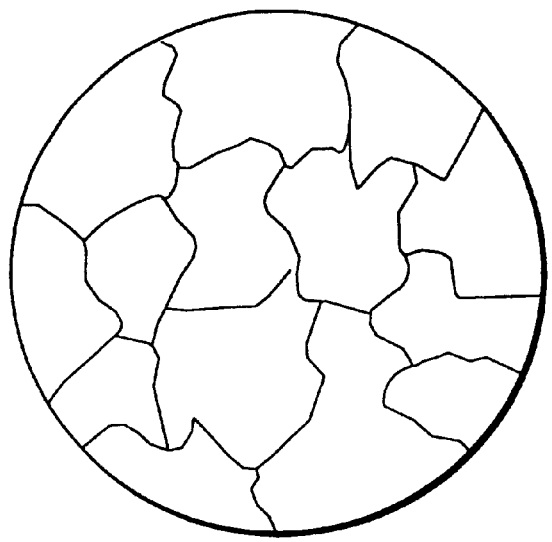
Figure 6:
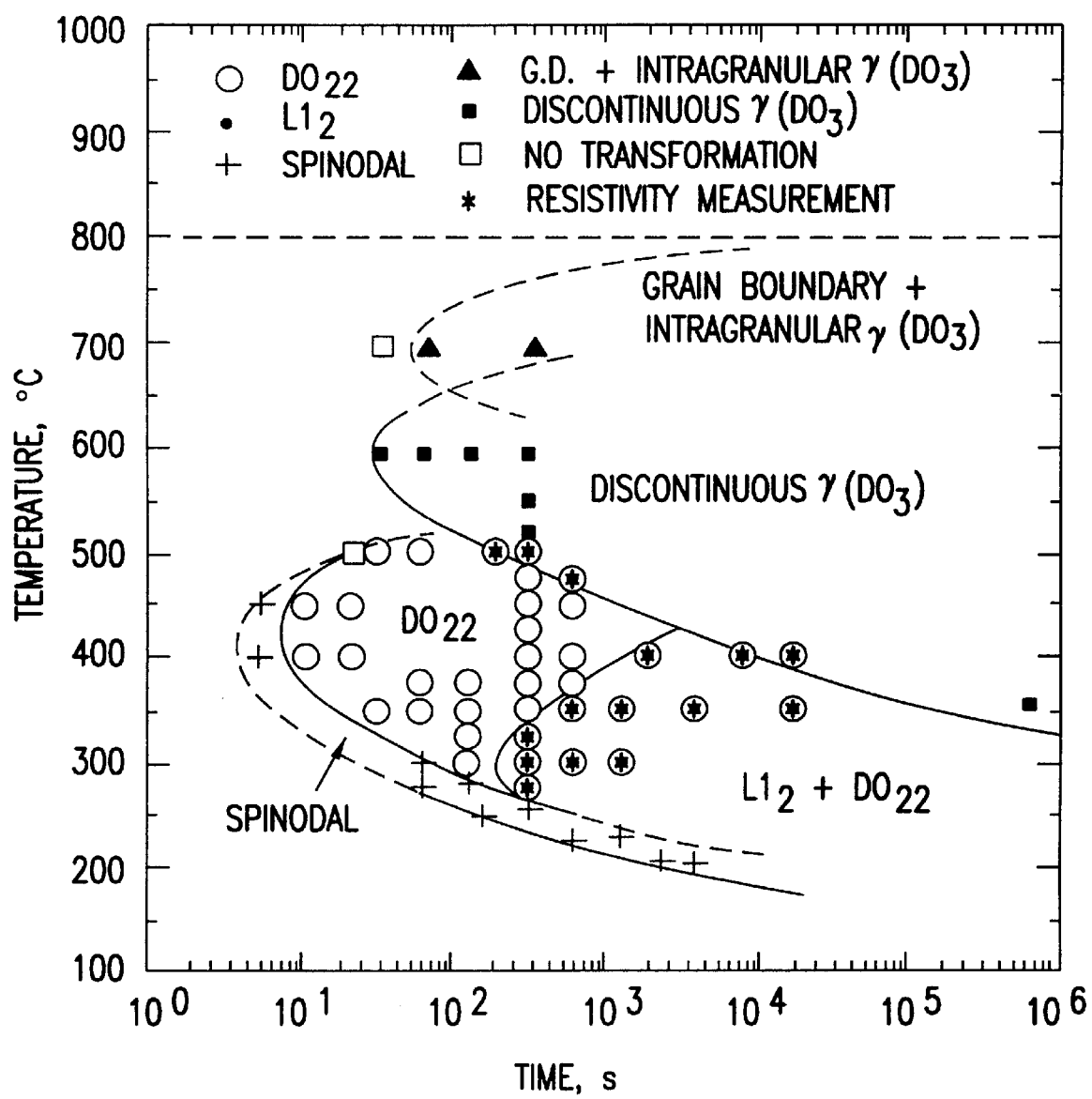
FIG. 6 is a time, temperature and transformation (TTT) diagram for a spinodal copper alloy.

During tests with various copper alloys in an attempt to develop electrodes with improved lifetime in excimer laser environments, Applicant subjected electrode samples to electric discharges in an inert gas environment (with no fluorine present) prior to exposure of the samples to the fluorine containing excimer laser gas. Applicant discovered that this reduced electrode erosion rate for a substantial period of time after which the erosion rate returned to normal. In an attempt to explain this behavior, Applicant rediscovered a known fact, i.e., that the inert gas heating of the surface of the brass material very substantially reduced the grain boundaries in the surface of the electrodes. FIG. 5A is a sketch of a microscopic section of a small section of a newly machine electrode surface. FIG. 5B is a sketch similar size section after the surface has been heated in an inert atmosphere. As is indicated by the two sketches, the surface heating produced a very substantial increase in grain size in the surface material and a substantial reduction in grain boundary layers. Applicant realized then that fluorine chemical attack of the copper alloys is concentrated at grain boundaries and that the surface heat treating was the cause of the temporary reduced fluorine caused erosion. Applicant then had machined electrode samples annealed thoroughly to temperature in the range of about 830° C. These samples were then tested as anodes and cathodes. When configured as anodes, the annealed samples exhibited substantially increased lifetime but when configured as cathodes the annealed samples exhibited longer lifetime but the difference was not substantial.

Applicant explains this unexpected result as follows: electrode erosion of the anode occurs primarily as a result of fluorine attack. This attack occurs in the first few nanoseconds of each pulse in a burst of pulses after the first pulse. During this time interval, the electric field in the fall region of the anode is extremely large due to the voltage potential of about 20,000 volts applied initially across the electrodes. The result is that a large portion of fluorine ions created by the previous pulse which remain in the fall region of the anode will be attracted to the anode surface at substantial velocity with a substantial portion of these ions chemically combining with the electrode atoms to produce fluorides which in turn erode away or may in some cases build up to interfere with performance.

Since the cathode is initially charged to a negative 20,000 volts, any fluorine ions in the fall region of the cathode will be repelled away so that fluorine caused erosion of the cathode is minor. (Some small amount of fluorine erosion probably results due in part to the voltage reversal that occurs at the tail end of the pulse (see FIG. 4B.)

Cathode erosion is caused primarily by sputtering caused by positive ions of Kr or Ne (for the KrF laser) or Ar or Ne (for the ArF laser) created in the fall region of the cathode. Applicant's subsequent examination of cathode copper based electrodes comprised of substantial portion of zinc indicates that some of the cathode erosion is due to zinc diffusion up to the surface.

Comparison examinations indicate that annealing of the cathode electrodes after machining reduces this zinc diffusion. Again Applicant's explanation of this phenomenon is that the reduction in the total grain boundary length reduces the tendency of the zinc to migrate to the surface.

For both the cathode and the anode it is important that the electrode be annealed after machining. Therefore, when we use the phrase "after machining annealed" we mean annealed after machining.

Choice of Copper Alloys

Applicant has conducted a substantial number of tests and research in an effort to select the best copper based alloy for use in the excimer lasers discussed in the background section. Prior art brass electrodes such as C36000 brass (61.5% Cu, 35.5% Zn and 3% Pb) exhibit lifetimes of about 2 billion pulses in an ArF laser and about 4 billion pulses in a KrF laser.

Applicant has discovered that aluminum bronze such as C63200 (82% Cu, 10% Al, 5% Ni and 3% Fe) is more resistant to fluorine attacks than prior art zinc brass such as C36000 brass (61.5% Cu, 35.5% Zn and 3% Pb). Therefore in one preferred embodiment of this invention Applicant recommends that the anode be fabricated using this C63200 aluminum-bronze and that the electrode be annealed after machining. Applicant recommended annealing process is as follows:

Heat anode at 830° C. in inert atmosphere (e.g. $N_2$ or a noble gas or in vacuum) for about 12 hours Allow to cool slowly in oven for approximately 8 hours.

This recommended temperature is several hundred degrees higher than typical recommended brass part annealing temperatures, which are normally in the range of about 425° C. to 600° C. (The reader should understand that the above recommended temperatures are substantially higher than the annealing temperatures needed to produce certain spinodal copper alloys which are discussed below.) This typical recommended annealing temperature range is not sufficient for use of the alloys as electrodes, and is intended for mechanical parts fabrication such as gears, and the like. Applicant believes that the annealing process reduces the boundary regions in the copper alloy to less than 25% of the machined but not annealed electrode.

Preferred Cathode

Applicant has tested the C63200 brass as a potential cathode electrode for these excimer lasers; however, Applicant's test indicate that the lifetime improvement indicated for the anode are not the same for the cathode and other copper based alloys are preferred for the cathode. Applicant expects that the aluminum in the cathode causes it to be more susceptible to sputter erosion and since sputter is the main cause of erosion of the cathode, heavier atoms are preferred for the cathode. Therefore, Applicant's preferred material for the cathode is C26000 brass (70% Cu, 29.93% Zn and 0.07% Pb). Another preferred material is C36000 brass which has been used by Applicant's employer for electrodes in its lasers for several years. These prior art electrodes were not annealed. Applicant's tests show that annealing the cathode after machining using the same procedure described above for the anode increases cathode lifetime. Applicant suspects that the increased cathode lifetime is a combined result of reduced zinc diffusion and some reduction in fluorine attack that occurs in the latter part of the discharge when the cathode functions as an anode.

Other Reduced Boundary Layer Copper Alloys

Many embodiments of the present invention similar to the above-described embodiment are possible. The most important feature of the present invention is that the electrodes have minimum crystal boundary regions. Boundary regions can be reduced by producing the electrode material using a process of spinodal decomposition. Another technique is to anneal the electrodes after they are fabricated. Preferably boundary regions should be reduced to less than 25% of boundary regions in electrodes machined from C36000 brass. Preferred annealing temperature should be a temperature about 50° C. below the softening point of the copper alloy, i.e., much higher than normal annealing temperatures to assure maximum reduction in boundary layers and maximum metallic grain size.

Spinodal Copper Alloys

Based on Applicant's discovery of the beneficial effects of annealing the machine electrodes, Applicant began searching the metallurgical literature for copper alloys with minimum grain boundaries. As a consequence of this search, Applicant decided to test a copper alloy known as spinodal bronze. This material is prepared utilizing a spinodal decomposition process discussed in the background section. This material was first produced in the 1930's and received some attention at that time but not much use has been made of the material until recently. Recent electron microscope studies have confirmed ordered crystal structures that are the same general type but differ in alloy concentrations with small repeated spacings. The result is a dramatic increase in strength and hardness. The material is also know to resist corrosion in sea water.

Erosion Test of Spinodal Alloy

Applicant has tested a spinodal alloy as an electrode in a fluorine gas environment against a standard prior art electrode material used in excimer lasers for several years. This material is C36000 brass (61.5% copper, 35.5% zinc and 3% lead). Conditions for both sets of electrodes were exactly the same. At the end of a 24 hour "torture test" the standard electrodes (both cathode and anode) were substantially eroded away. Erosion of the spinodal material for both the cathode and anode was barely detectable. The precise results were:

|  | C36000 Brass Erosion | Spinodal Brass Erosion |
| --- | --- | --- |
| Cathode | 3.94 mg | 0.61 mg |
| Anode | 7.65 mg | not measurable |

The tests have been repeated and these results have been confirmed.

While the invention has been described above with specificity in terms of preferred embodiments, the reader should understand and recognize that many changes and alterations could be made without deviating from the spirit of the invention. For example, the principals of this invention could be applied to many other gas discharge lasers other than KrF lasers such as, for example, ArF lasers, $F_2$ laser. These electrodes made from a spinodal alloy should also be useful in many applications other than lasers, especially where the atmosphere in which the discharge occurs is a corrosive one. Generally the electrode would be fabricated from material such as spinodal copper alloy bar stock; however, in some cases it might be preferable to fabricate the electrode first from standard copper alloy material of a composition permitting spinodal decomposition and then anneal the electrode using an annealing process which produces the spinodal decomposition. Therefore, the scope of the invention should be determined by the appended claims and their legal equivalents.

I claim:

1. An excimer laser with long life electrodes said laser comprising:
   A) a laser chamber containing a laser gas comprising fluorine;
   B) an electrode set comprising at least one electrode comprised of a spinodal copper alloy;
   C) a circulating means for circulating said laser gas between said elongated electrode;
   D) a pulse power electrical system for generating electrical pulses between said electrode to produce a laser gain medium.

2. A laser as in claim 1 wherein said copper alloy is comprised of copper, nickel and tin.

3. An electrode as in claim 1 wherein composition of said alloy is about 81 percent copper, about 7 percent nickel and about 11 percent tin.

4. An electrode as in claim 1 wherein said alloy is C96800.

5. An electrode as in claim 1 wherein said alloy is C72900 ASTM B740-84.

6. An electrode as in claim 1 wherein said electrode is installed in a gas environment containing a halogen gas.

7. An electrode as in claim 6 wherein said halogen gas is fluorine.

* * * * *